United States Patent
Chen et al.

(10) Patent No.: US 11,854,853 B2
(45) Date of Patent: Dec. 26, 2023

(54) WAFER POSITIONING METHOD AND APPARATUS

(71) Applicant: Taiwan Semiconductor Manufacturing Co., Ltd., Hsinchu (TW)

(72) Inventors: Chia-Cheng Chen, Chu (TW); Chih-Kai Yang, Taipei (TW); Liang-Yin Chen, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 275 days.

(21) Appl. No.: 17/199,980

(22) Filed: Mar. 12, 2021

(65) Prior Publication Data
US 2022/0293448 A1 Sep. 15, 2022

(51) Int. Cl.
*H01L 21/68* (2006.01)
*H01L 23/544* (2006.01)
*G06T 7/73* (2017.01)
*G06T 1/00* (2006.01)
*G06T 7/00* (2017.01)

(52) U.S. Cl.
CPC .......... *H01L 21/681* (2013.01); *G06T 1/0014* (2013.01); *G06T 7/0004* (2013.01); *G06T 7/73* (2017.01); *H01L 23/544* (2013.01); *G06T 2207/30148* (2013.01); *H01L 2223/54493* (2013.01)

(58) Field of Classification Search
CPC ................. H01L 21/681; H01L 23/544; H01L 2223/54493; G06T 7/73; G06T 1/0014; G06T 7/0004; G06T 2207/30148
See application file for complete search history.

(56) References Cited

U.S. PATENT DOCUMENTS

| | | | |
|---|---|---|---|
| 10,651,065 B2 | 5/2020 | Hiester et al. | |
| 10,755,960 B2 | 8/2020 | Bonora et al. | |
| 2005/0285052 A1* | 12/2005 | Wang | H01L 21/67213 250/492.21 |
| 2008/0013089 A1 | 1/2008 | Ishii et al. | |

FOREIGN PATENT DOCUMENTS

| | | | | |
|---|---|---|---|---|
| CN | 103208449 A | * | 7/2013 | ........... H01L 21/027 |
| CN | 103208449 A | | 7/2013 | |
| CN | 108615699 A | | 10/2018 | |
| JP | S63296339 A | * | 12/1988 | ........... H01L 21/027 |
| TW | 200620407 A | | 6/2006 | |
| TW | I709186 B | | 11/2020 | |

* cited by examiner

*Primary Examiner* — Jamil Ahmed
(74) *Attorney, Agent, or Firm* — Slater Matsil, LLP

(57) ABSTRACT

A method of correcting a misalignment of a wafer on a wafer holder and an apparatus for performing the same are disclosed. In an embodiment, a semiconductor alignment apparatus includes a wafer stage; a wafer holder over the wafer stage; a first position detector configured to detect an alignment of a wafer over the wafer holder in a first direction; a second position detector configured to detect an alignment of the wafer over the wafer holder in a second direction; and a rotational detector configured to detect a rotational alignment of the wafer over the wafer holder.

20 Claims, 11 Drawing Sheets

WAFER POSITIONING METHOD AND APPARATUS

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
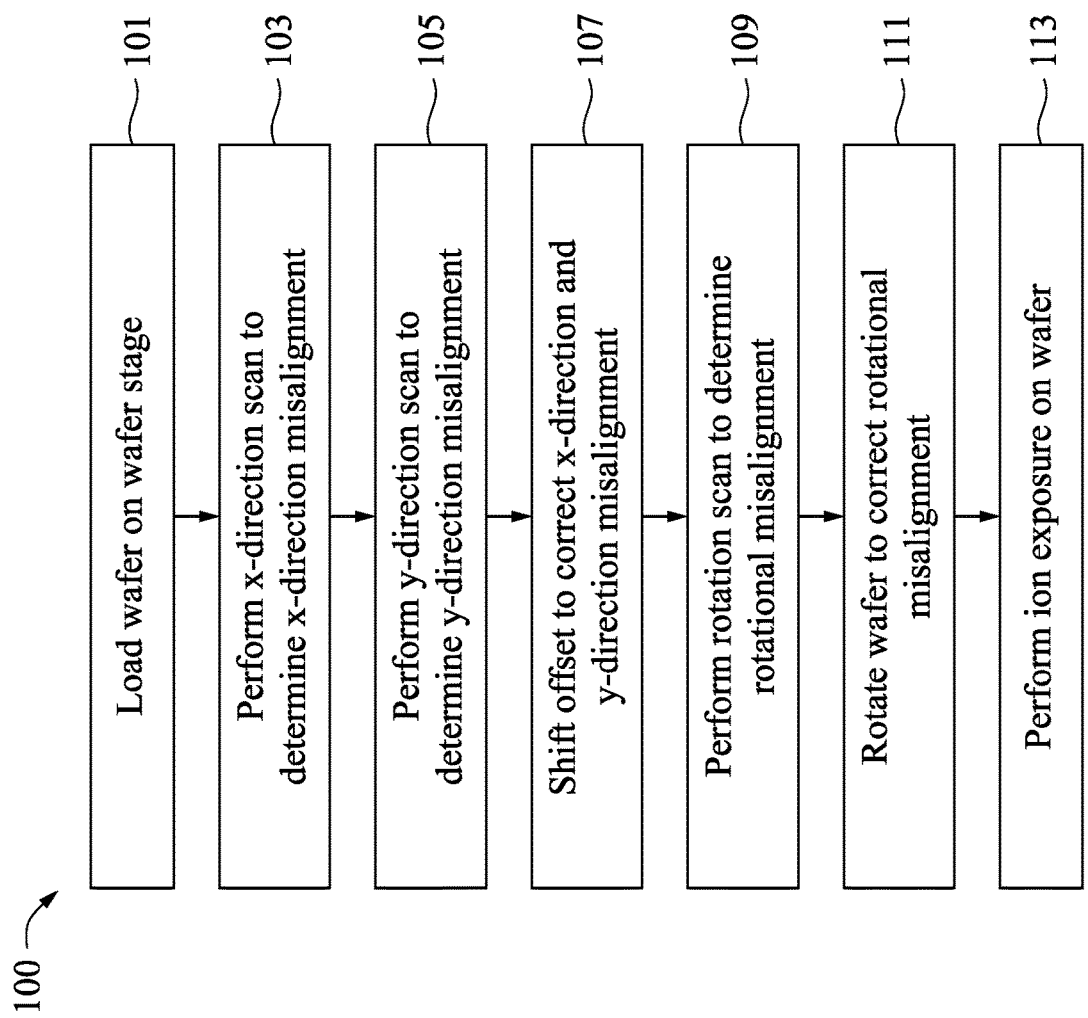
FIG. 1 is a flow chart of a method of detecting and correcting for a misalignment of a wafer on a wafer stage, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide an apparatus for detecting and correcting a position of a wafer on a wafer holder in an ion exposure apparatus and methods of using the same. The wafer may be loaded on the wafer holder. The wafer holder is connected to a wafer stage, which moves the wafer holder and the loaded wafer relative to an ion beam used to perform an ion exposure process on the wafer. After the wafer is loaded, the wafer stage moves the wafer in an x-direction to determine an x-direction misalignment of the wafer and moves the wafer in a y-direction to determine a y-direction misalignment of the wafer. Light emitter/detector pairs may be used to detect the x-direction misalignment and the y-direction misalignment of the wafer. The wafer stage shifts the position of the wafer and the wafer holder in order to correct for the detected x-direction misalignment and y-direction misalignment of the wafer. The wafer stage performs a rotational scan in order to determine a rotational misalignment of the wafer. The wafer may include an alignment mark and a camera and/or light emitter/detector pair may be used to detect the alignment mark, allowing for the rotational misalignment of the wafer to be determined. The wafer stage shifts the rotational position of the wafer and the wafer holder in order to correct for the detected rotational misalignment of the wafer. The wafer stage then tilts the wafer holder and the wafer to a desired tilt angle and the ion exposure process is performed on the wafer. Correcting the position of the wafer to account for misalignments between the wafer and the wafer holder prior to performing the ion exposure process on the wafer improves within-wafer uniformity, reduces wafer-to-wafer process variations, reduces device defects, and improves device performance.

FIG. 1 illustrates a flow chart of a method 100 for detecting and correcting a misalignment of a wafer on a wafer holder, in accordance with some embodiments. The method 100 may be implemented in the fabrication of semiconductor devices. In some embodiments, the method 100 may be implemented in an ion exposure apparatus. The method 100 may be performed prior to exposing the wafer to an ion beam in an ion exposure process. The method 100 may include various detection and correction steps and may be performed in any suitable order. Although the current application discusses the alignment apparatus and method in the context of an ion exposure apparatus and an ion exposure process, the alignment apparatus and method may be used in any semiconductor manufacturing apparatuses and processes.

In step 101, a wafer is loaded on a wafer holder connected to a wafer stage. The wafer stage may include one or more driving units, such as motors, which may move, rotate, and tilt the wafer holder with respect to a major axis of an ion beam to be used during an ion exposure process. The wafer may be loaded on a top surface of the wafer holder, which may be parallel to the major axis of the ion beam. When the wafer is loaded on the wafer holder, there may be misalignments between the wafer and the wafer holder, such as x-direction misalignments, y-direction misalignments, and rotational misalignments. Exposing the wafer to the ion beam without correcting for the misalignments between the wafer and the wafer holder may result in uniformity issues across the wafer, wafer-to-wafer process variations, device defects, and reduced device performance. As such, the position of the wafer may be corrected for misalignments prior to the wafer being exposed to the ion beam.

After the wafer is loaded on the wafer holder, an x-direction scan is performed in step 103 to determine the x-direction misalignment of the wafer on the wafer holder and a y-direction scan is performed in step 105 to determine the y-direction misalignment of the wafer on the wafer stage. Although the x-direction scan is illustrated and discussed as being performed before the y-direction scan, the x-direction scan and the y-direction scan may be performed in any order.

The x-direction scan includes using the wafer stage to move the wafer holder and the wafer in the x-direction, while using x-direction position sensors to detect a first position of a first edge of the wafer relative to the wafer holder. The y-direction scan includes using the wafer stage to move the wafer holder and the wafer in the y-direction, while using y-direction position sensors to detect a second position of a second edge of the wafer relative to the wafer holder. The x-direction sensors and the y-direction sensors may include obstruction sensors. In some embodiments, the x-direction sensors and the y-direction sensors may each include a light emitter (e.g., a laser or the like) and a light detector (e.g., a photodetector or the like); however, any suitable sensors may be used. The x-direction sensors and the y-direction sensors may be located in specific fixed positions. The light detectors may detect when the wafer blocks light emitted from the light emitters, which allows for positions of edges of the wafer to be detected. The x-direction misalignment and the y-direction misalignment of the wafer may then be determined based on the detected position of the wafer and the position of the wafer holder. In step 107, once the x-direction misalignment and the y-direction misalignment of the wafer on the wafer holder are determined, the wafer stage shifts the position of the wafer holder in the x-direction and the y-direction in order to correct the position of the wafer for the x-direction and y-direction misalignments.

In step 109, a rotational scan is performed in order to determine a rotational misalignment of the wafer on the wafer holder. In some embodiments, the wafer may include one or more alignment marks, which may be used to determine the rotational position of the wafer with respect to the wafer holder. In some embodiments, the alignment marks may include notches which may be disposed in a sidewall of the wafer. In some embodiments, the rotational scan includes capturing an image of the wafer using a camera and analyzing the image. The image may be analyzed in order to determine the position of the alignment mark, which indicates the rotational misalignment of the wafer over the wafer holder. In some embodiments, the rotational scan includes rotating the wafer holder, while using a rotational sensor to detect the position of the alignment mark. The rotational sensor may include a light emitter and a light detector. The light detector may detect light reflected from surfaces of the wafer and/or the wafer holder while the wafer and the wafer holder are rotated. Based on variation in the intensity, wavelength, or the like of light received by the light detector, the position of the alignment mark may be determined. The rotational misalignment of the wafer may then be determined based on the detected rotation of the wafer and the position of the wafer holder. The rotational scan may be performed by the camera and/or the rotational sensor. The camera and rotational sensor may be located in specific fixed positions.

In step 111, once the rotational misalignment of the wafer on the wafer holder is determined, the wafer stage shifts the rotational position of the wafer holder to correct for the rotational misalignment of the wafer. Although the rotational scan and correction are illustrated and discussed as being performed after the x-direction scan and the y-direction scan and after the x-direction correction and the y-direction correction, in some embodiments, the rotational scan and the rotational correction may be performed before the x-direction scan, the y-direction scan, the x-direction correction, and the y-direction correction or between any of the x-direction scan, the y-direction scan, the x-direction correction, and the y-direction correction.

Once the x-direction misalignment, the y-direction misalignment, and the rotational misalignment of the wafer on the wafer holder have been determined and corrected, the wafer holder may be tilted before exposing the wafer to the ion beam. For example, the wafer stage may tilt the wafer holder and the wafer such that major surfaces of the wafer holder and the wafer are perpendicular to an axis of the ion beam, or at a specified tilt angle to the ion beam. Then, in step 113, the wafer is exposed to the ion beam in the ion exposure process. Correcting the misalignments between the wafer and the wafer holder prior to exposing the wafer to the ion beam improves the uniformity of the ion exposure process across the surface of the wafer, reduces wafer-to-wafer process variations, reduces device defects, and improves device performance.

Figure 2B:
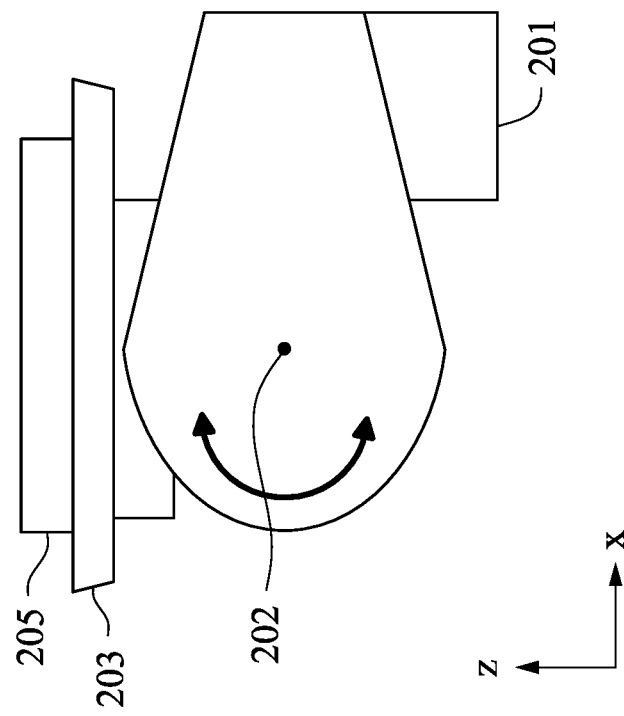
FIGS. 2A, 2B, 3, 4, 5, 6, 7A, 7B, 8, 9, 10A and 10B are side views and top-down views of intermediate stages in the method, in accordance with some embodiments.
Figure 2A:
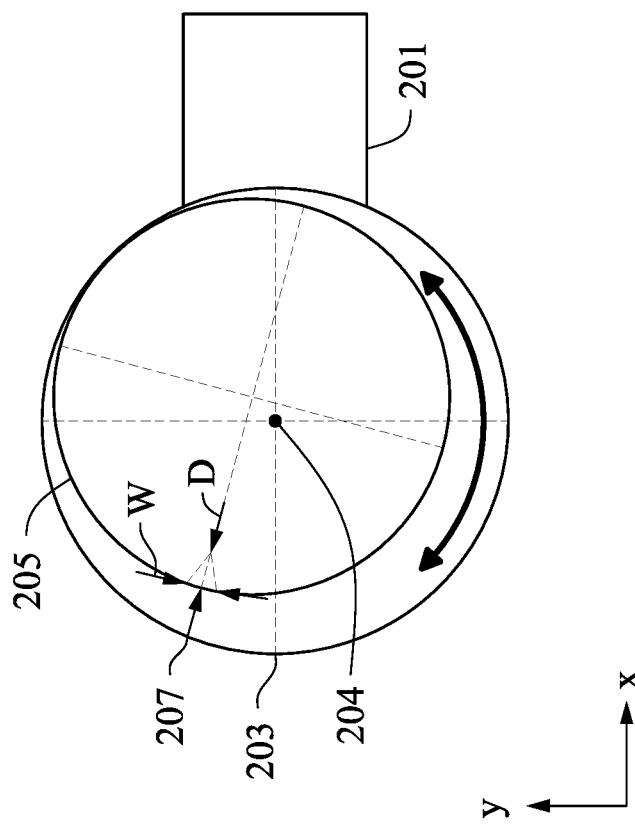

FIGS. 2A through 10B illustrate side views and top-down views of portions of an ion implanter during performance of the method 100. FIGS. 2A, 3, 4, 5, 6, 7A, 9, and 10A illustrate side views and FIGS. 2B, 7B, 8, and 10B illustrate top-down views. In FIGS. 2A and 2B, a wafer 205 is loaded on a wafer holder 203, which is connected to a wafer stage 201. The wafer stage 201 may include one or more driving units, such as motors, which may be used to move the wafer holder 203 in the x-direction, the y-direction, and the z-direction, rotate the wafer holder 203 around a central axis 204 of the wafer holder 203 and tilt/rotate the wafer holder 203 around a central axis 202 of the wafer stage 201.

The wafer 205 may be loaded on a top surface of the wafer holder 203 while the wafer holder 203 is in an initial position in an xy-plane. The xy-plane may be parallel to an axis of an ion beam to which the wafer will subsequently be exposed. The wafer holder 203 may subsequently be tilted to a yz-plane (e.g., a plane perpendicular to the axis of an ion beam to which the wafer will subsequently be exposed), or at a tilt angle to the yz-plane prior to performing an ion exposure process on the wafer 205. In some embodiments, the wafer holder 203 may hold the wafer 205 on a surface thereof using vacuum pressure, electrostatic forces, or the like. The wafer holder may include heating and cooling mechanisms in order to control the temperature of the wafer 205 during the ion exposure process.

The wafer 205 may include various material layers (e.g., dielectric material layers, semiconductor material layers, conductive material layers, and/or the like) and/or IC features (e.g., doped regions/features, gate features, interconnect features, and/or the like), depending on the stage of IC fabrication in which the method 100 is performed. The various material layers and IC features of the wafer 205 may be formed over a substrate, such as a silicon substrate. In some embodiments, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In some embodiments, the substrate is a semiconductor-on-insulator substrate, such as a silicon-on-insulator (SOI) substrate, a silicon germanium-on-insulator (SGOI)

substrate, or a germanium-on-insulator (GOI) substrate. Semiconductor-on-insulator substrates may be fabricated using separation by implantation of oxygen (SIMOX), wafer bonding, and/or other suitable methods.

As illustrated in FIG. 2A, the wafer 205 may include an alignment mark 207. In some embodiments, the alignment mark 207 may be a notch formed in a sidewall of the wafer 205 and may be used during the rotational misalignment scan and correction, discussed below with respect to FIGS. 7A through 9. In FIG. 2A, the alignment mark 207 is illustrated as having a triangular shape; however, the alignment mark 207 may have a rectangular shape, a round shape, or any other suitable shape. The alignment mark 207 may have a width W ranging from about 1 mm to about 4 mm and a depth D from a sidewall of the wafer 205 ranging from about 1 mm to about 4 mm. As such, the alignment mark 207 may be easily detectable, without overly limiting the area of the wafer 205 occupied by the alignment mark 207. In some embodiments, the alignment mark 207 may be a reflective alignment mark, a high-contrast alignment mark, or the like.

Figure 3:
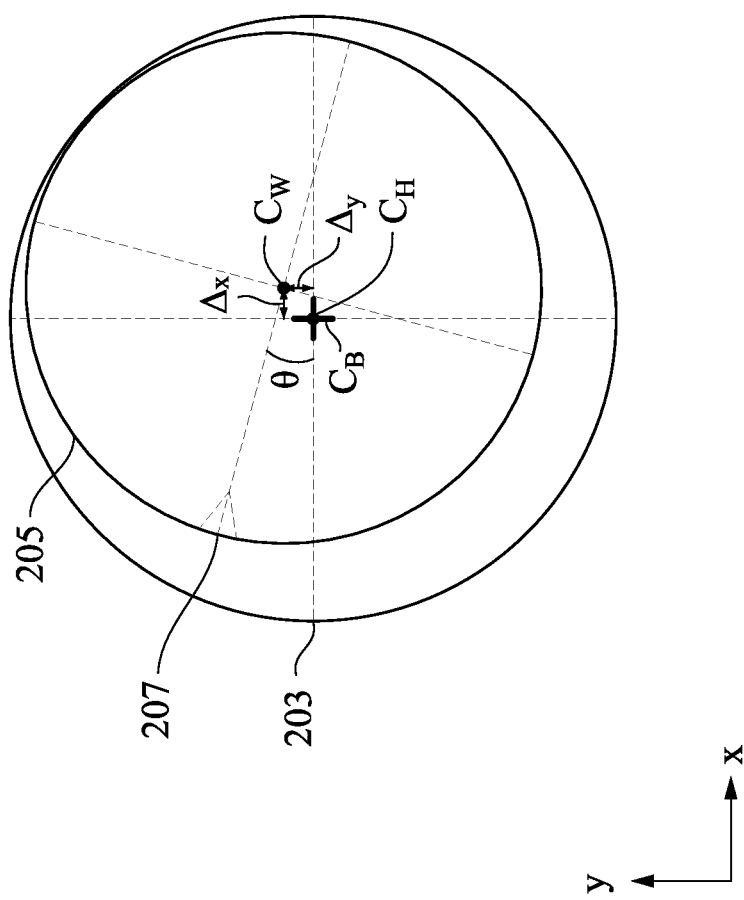

As illustrated in FIG. 3, the wafer 205 may be loaded on the wafer holder 203 with x-direction misalignments, y-direction misalignments, and rotational misalignments between a center point $C_W$ of the wafer 205 and a center point $C_H$ of the wafer holder 203. The magnitude of the x-direction misalignments are represented as $\Delta_x$, the magnitude of the y-direction misalignments are represented as $\Delta_y$, and the magnitude of the rotational misalignments are represented as $\theta$. A center point $C_B$ of an ion beam to which the wafer 205 is subsequently exposed may initially be set to the center point $C_H$ of the wafer holder 203. The steps illustrated in FIGS. 4 through 9 and discussed subsequently are used to shift the position of the wafer 205 such that the center point of the ion beam is aligned with the center point of the wafer 205, thereby improving within-wafer uniformity, reducing wafer process variations, reducing device defects, and improving device performance.

Figure 4:
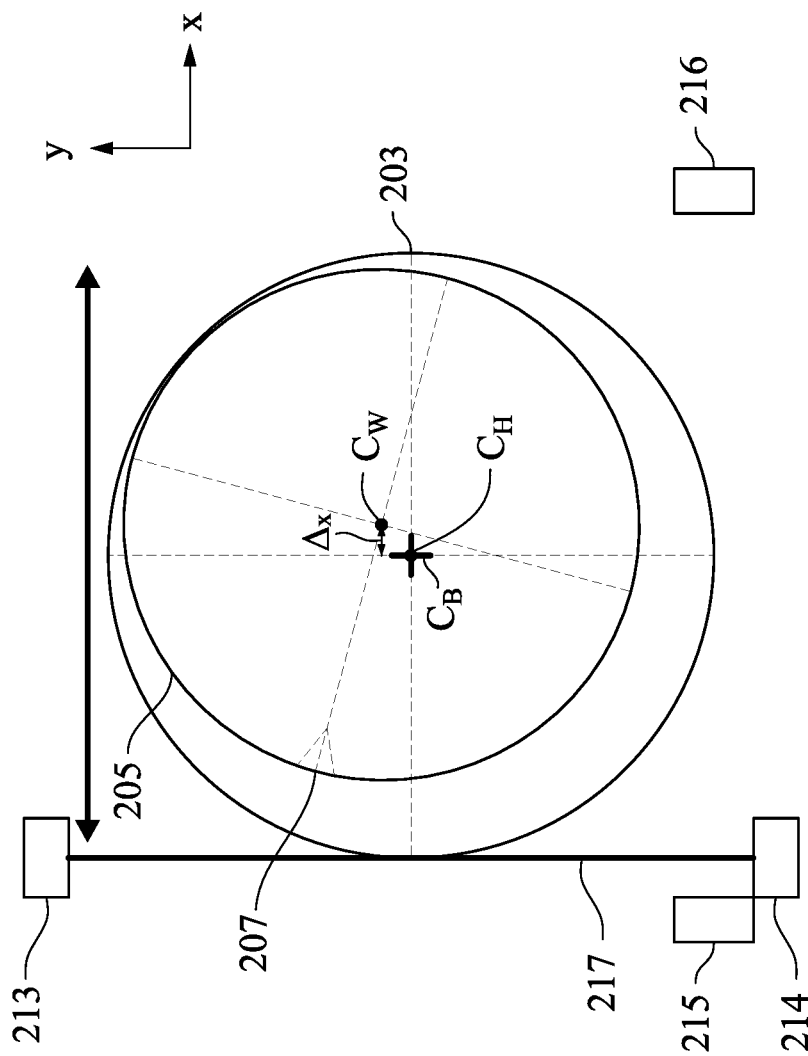

In FIG. 4, an x-direction scan is performed on the wafer 205 to determine the x-direction misalignment $\Delta_x$. As illustrated in FIG. 4, the apparatus may include an x-direction light emitter 213, an x-direction light detector 214, a y-direction light emitter 215, and a y-direction light detector 216. The x-direction light emitter 213 and the x-direction light detector 214 may collectively be referred to as an x-direction light emitter/detector pair and the y-direction light emitter 215 and the y-direction light detector 216 may collectively be referred to as a y-direction light emitter/detector pair. The x-direction light emitter/detector pair and the y-direction light emitter/detector pair may include obstruction sensors. In some embodiments, the x-direction light emitter 213 and the y-direction light emitter 215 may include lasers or the like. In some embodiments, the x-direction light detector 214 and the y-direction light detector 216 may include photodetectors or the like. Any suitable sensors may be used for the x-direction sensors and the y-direction sensors. The x-direction light emitter 213, the x-direction light detector 214, the y-direction light emitter 215, and the y-direction light detector 216 may be located in specific fixed positions. The x-direction light emitter 213, the x-direction light detector 214, the y-direction light emitter 215, and the y-direction light detector 216 may be located in a plane parallel to the xy-plane and major surfaces of the wafer 205 and the wafer holder 203 when the wafer holder 203 is in the initial position.

The x-direction scan is performed by using the wafer stage 201 to move the wafer holder 203 and the wafer 205 in the x-direction. The x-direction light emitter 213 emits a light beam 217 (e.g., a laser beam or the like), which is directed towards the x-direction light detector 214. As illustrated in FIG. 4, the light beam 217 extends in a direction parallel to the y-axis. The x-direction light detector 214 detects when the wafer 205 blocks the light beam 217 emitted from the x-direction light emitter 213. This indicates the edge of the wafer 205, from which the position of the wafer 205 in the x-direction may be determined. The x-direction misalignment $\Delta_x$ of the wafer 205 may then be calculated based on the position of the wafer holder 203 when the edge of the wafer 205 is detected.

Figure 5:
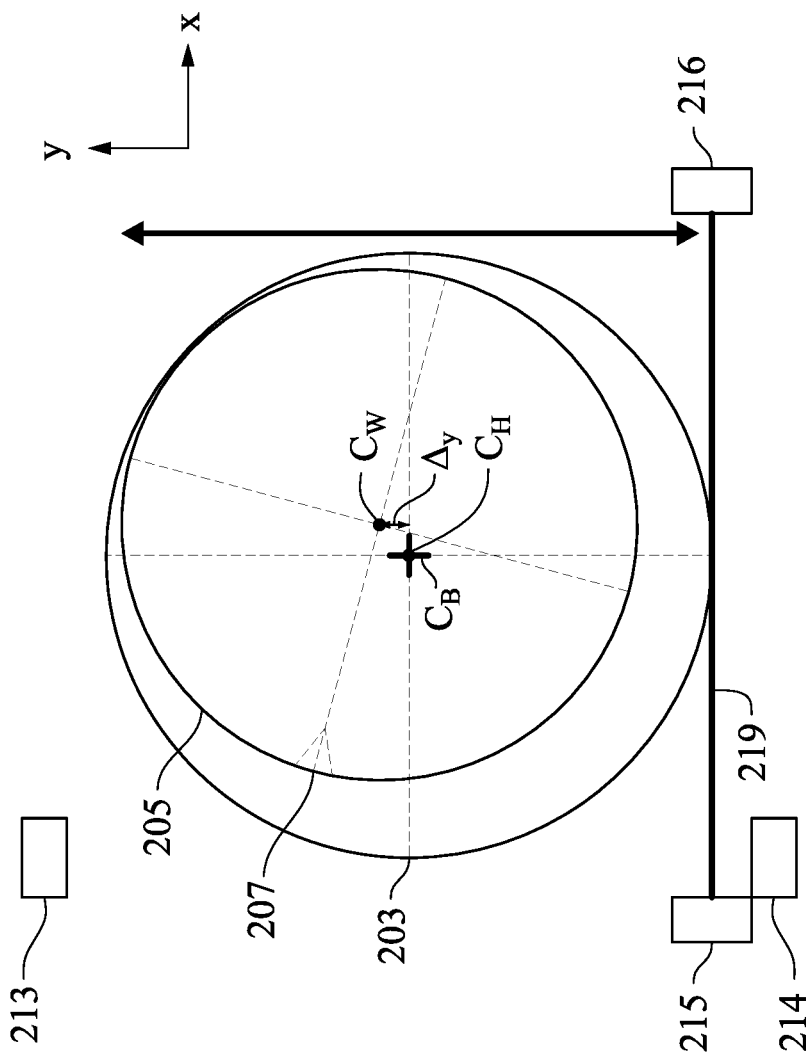

In FIG. 5, a y-direction scan is performed on the wafer 205 to determine the y-direction misalignment $\Delta_y$. The y-direction scan is performed by using the wafer stage 201 to move the wafer holder 203 and the wafer 205 in the y-direction. The y-direction light emitter 215 emits a light beam 219 (e.g., a laser beam or the like), which is directed towards the y-direction light detector 216. As illustrated in FIG. 5, the light beam 219 extends in a direction parallel to the x-axis. The y-direction light detector 216 detects when the wafer 205 blocks the light beam 219 emitted from the y-direction light emitter 215. This indicates the edge of the wafer 205, from which the position of the wafer 205 in the y-direction may be determined. The y-direction misalignment $\Delta_y$ of the wafer 205 may then be calculated based on the position of the wafer holder 203 when the edge of the wafer 205 is detected.

Figure 6:
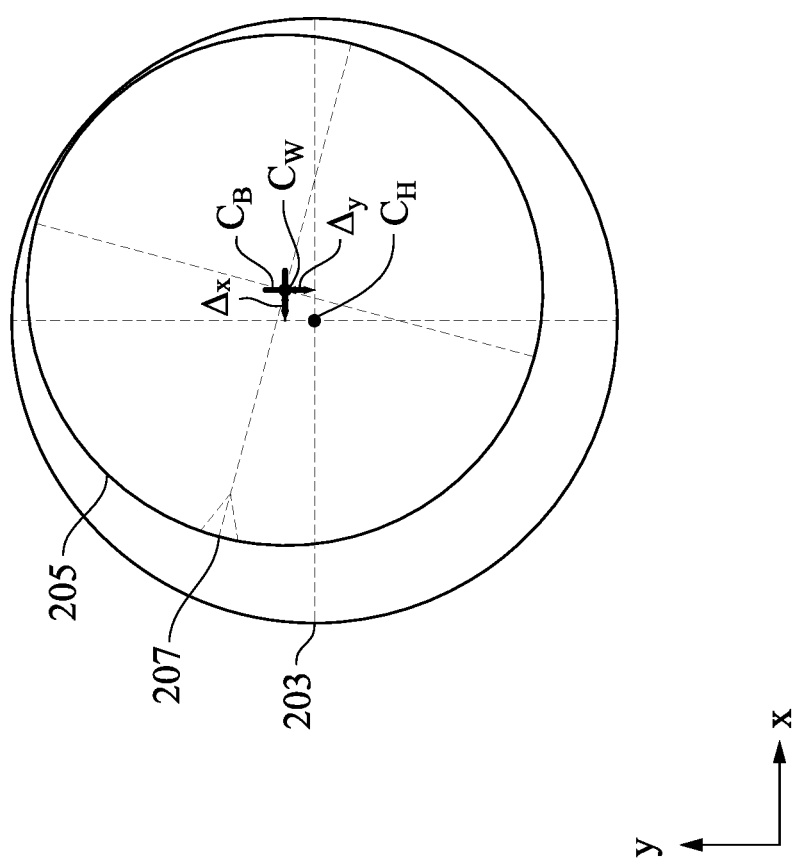

In FIG. 6, the wafer stage 201 adjusts the position of the wafer holder 203 and the wafer 205 in order to correct for the x-direction misalignment $\Delta_x$ and the y-direction misalignment $\Delta_y$. As illustrated in FIG. 6, after the positions of the wafer holder 203 and the wafer 205 are adjusted, the center point $C_B$ of the ion beam is aligned with the center point $C_W$ of the wafer 205 and both the center point $C_B$ of the ion beam and the center point $C_W$ of the wafer 205 are misaligned with the center point $C_H$ of the wafer holder 203 by the x-direction misalignment $\Delta_x$ and the y-direction misalignment $\Delta_y$. Aligning the center point $C_W$ of the wafer 205 with the center point $C_B$ of the ion beam prior to performing an ion exposure process improves within-wafer uniformity, reduces wafer process variations, reduces device defects, and improves device performance.

Figure 7B:
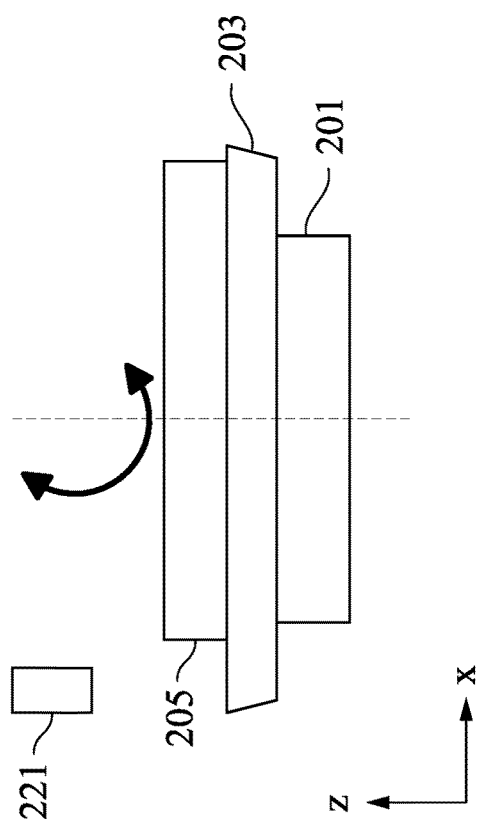
Figure 7A:
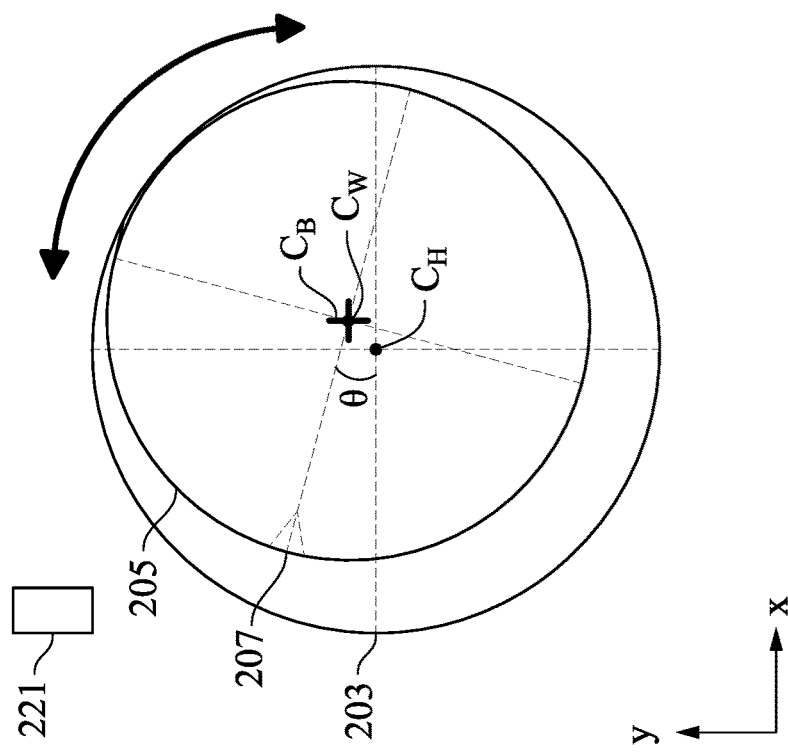

FIGS. 7A and 7B illustrate a process for performing a rotational scan on the wafer 205, in accordance with some embodiments. As illustrated in FIGS. 7A and 7B, a rotational camera 221 may be included over the wafer 205 and the wafer holder 203. The rotational camera 221 may be located in a specific fixed position. The rotational camera 221 may be used to capture an image of the wafer 205 and the wafer holder 203. The image may then be analyzed in order to determine the position of the alignment mark 207 or any other identifying features on the surface of the wafer 205. Based on the position of the alignment mark 207, the rotational position of the wafer 205 may be determined. The rotational misalignment $\theta$ of the wafer 205 may then be calculated based on the rotational position of the wafer holder 203 and the rotational position of the wafer 205.

Figure 8:
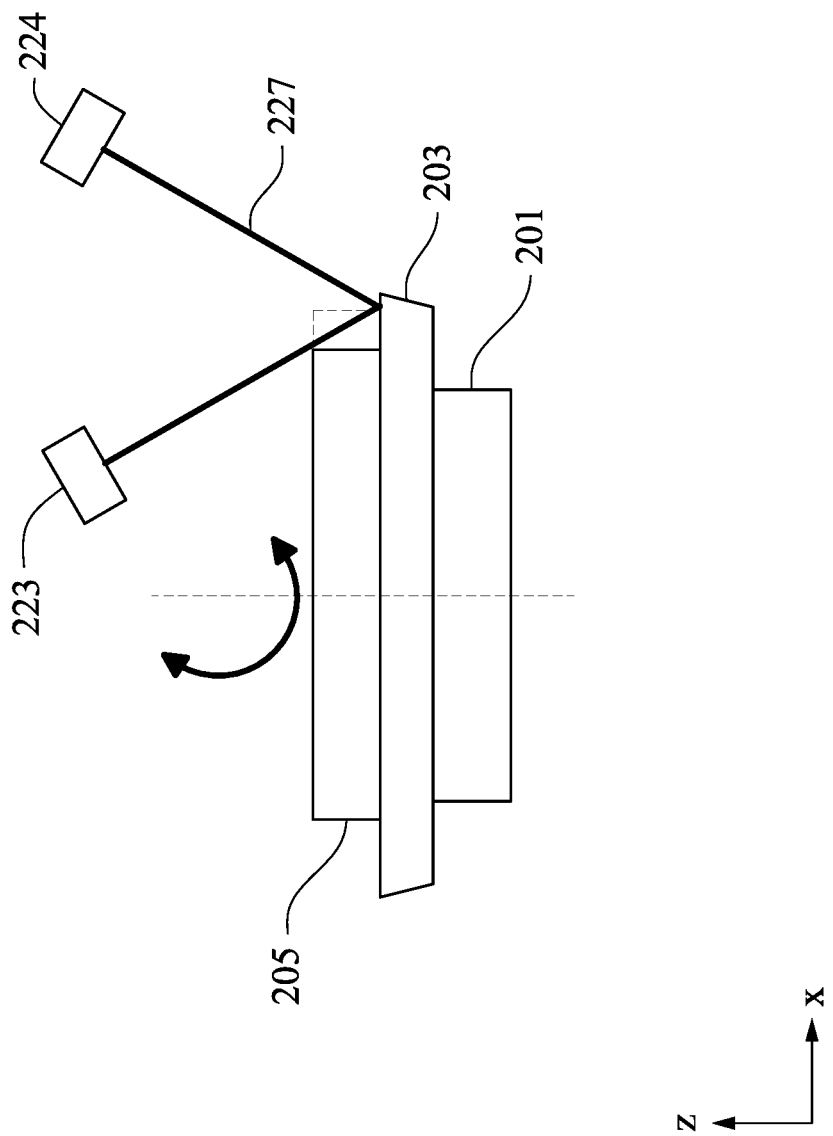

FIG. 8 illustrates an additional process for performing a rotational scan on the wafer 205, in accordance with some embodiments. The additional process illustrated in FIG. 8 may be performed in addition to, or in place of the process illustrated in and discussed with reference to FIGS. 7A and 7B. As illustrated in FIG. 8, the apparatus may include a rotational light emitter 223 and a rotational light detector 224. The rotational light emitter 223 and the rotational light detector 224 may collectively be referred to as a rotational light emitter/detector pair. The rotational light emitter/detector pair may include obstruction sensors. In some embodiments, the rotational light emitter 223 may include a laser or the like. In some embodiments, the rotational light detector 224 may include a photodetector or the like. Any suitable sensors may be used for the rotational sensors. The rotational light emitter 223 and the rotational light detector 224 may be located in specific fixed positions. The rotational light emitter 223 and the rotational light detector 224 may be directed towards the top surfaces of the wafer 205 and the wafer holder 203 at angles oblique to the xy-plane and major surfaces of the wafer 205 and the wafer holder 203 when the wafer holder 203 is in the initial position.

The rotational scan is performed by using the wafer stage 201 to rotate the wafer holder 203 and the wafer 205. The rotational light emitter 223 emits a light beam 227 (e.g., a laser beam or the like), which is directed towards the wafer 205 and the wafer holder 203 and reflects off a surface of the wafer 205 or the wafer holder 203 towards the rotational light detector 224. The rotational light detector 224 detects a change in the reflected light beam 227 indicating the presence of the alignment mark 207. Based on the position of the alignment mark 207, the rotational position of the wafer 205 may be determined. The rotational misalignment θ of the wafer 205 may then be calculated based on the rotational position of the wafer holder 203 and the rotational position of the wafer 205.

Figure 9:
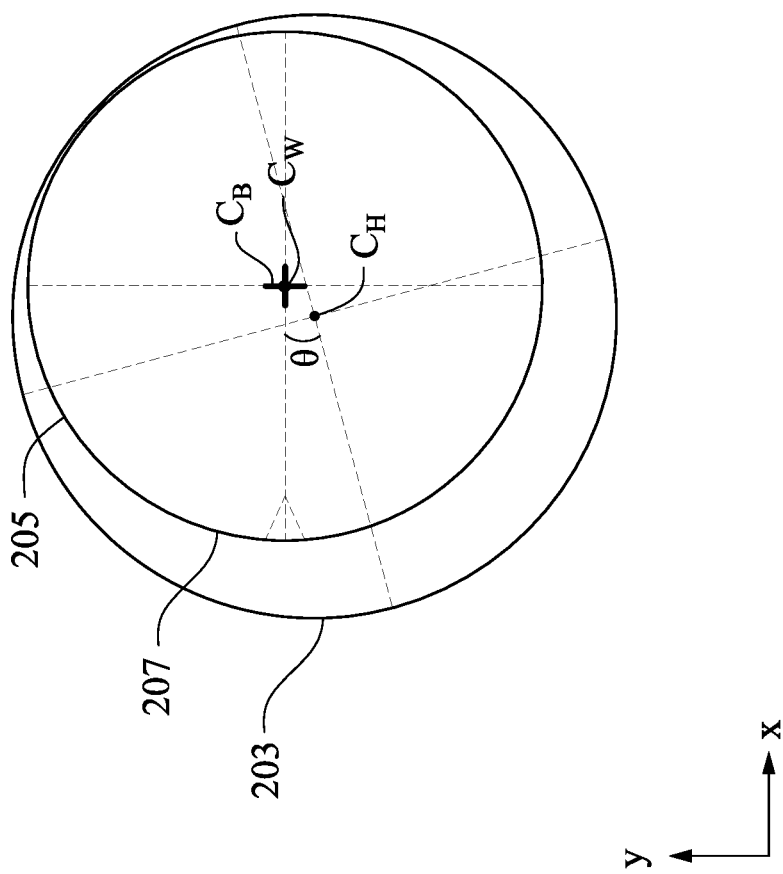

In FIG. 9, the wafer stage 201 adjusts the rotation of the wafer holder 203 and the wafer 205 in order to correct for the rotational misalignment θ. As illustrated in FIG. 9, after the rotation of the wafer holder 203 and the wafer 205 are adjusted, the rotation of the center point $C_W$ of the wafer 205 is aligned with the rotation of the center point $C_B$ of the ion beam and both the rotation of the center point $C_B$ of the ion beam and the rotation of the center point $C_W$ of the wafer 205 are misaligned with the rotation of the center point $C_H$ of the wafer holder 203 by the rotational misalignment θ. Aligning the center point $C_W$ of the wafer 205 with the center point $C_B$ of the ion beam prior to performing an ion exposure process improves within-wafer uniformity, reduces wafer process variations, reduces device defects, and improves device performance.

In embodiments in which the rotational scan is performed after correcting the x-direction misalignment and the y-direction misalignment of the wafer 205, the wafer stage 201 may move the wafer holder 203 and the wafer 205 in the x-direction and the y-direction while rotating the wafer holder 203 and the wafer 205 during both the rotational scan and the rotational correction. Specifically, the wafer stage 201 may rotate the wafer holder 203 and the wafer 205 rotate around the center point $C_W$ of the wafer 205. This keeps the center point $C_B$ of the ion beam aligned with the center point $C_W$ of the wafer 205 and prevents additional x-direction misalignments and y-direction misalignments. In some embodiments, the rotational scan and/or the subsequent rotational correction may be performed before the x-direction and y-direction scans and corrections. In embodiments in which the rotational scan and/or the rotational correction are performed before the x-direction and y-direction scans and corrections, the wafer stage 201 may rotate the wafer holder 203 and the wafer 205 around the center point $C_H$ of the wafer holder 203.

Figure 10B:
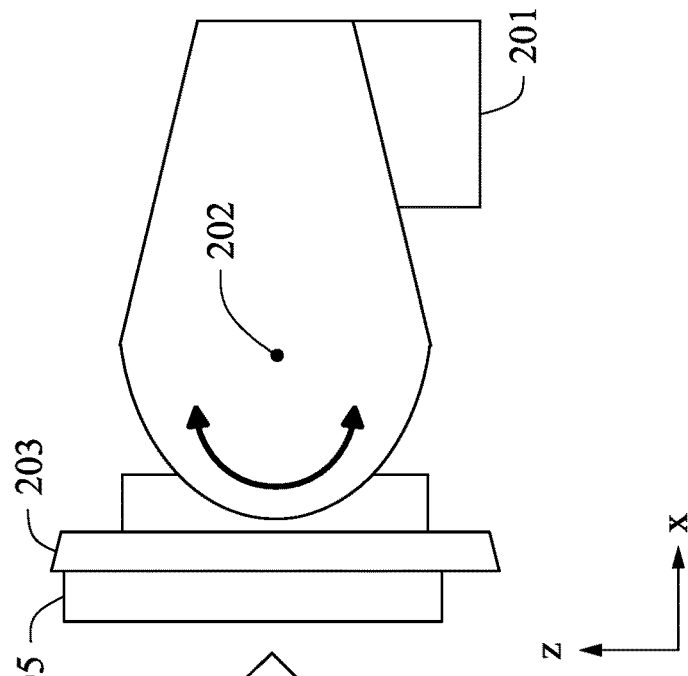
Figure 10A:
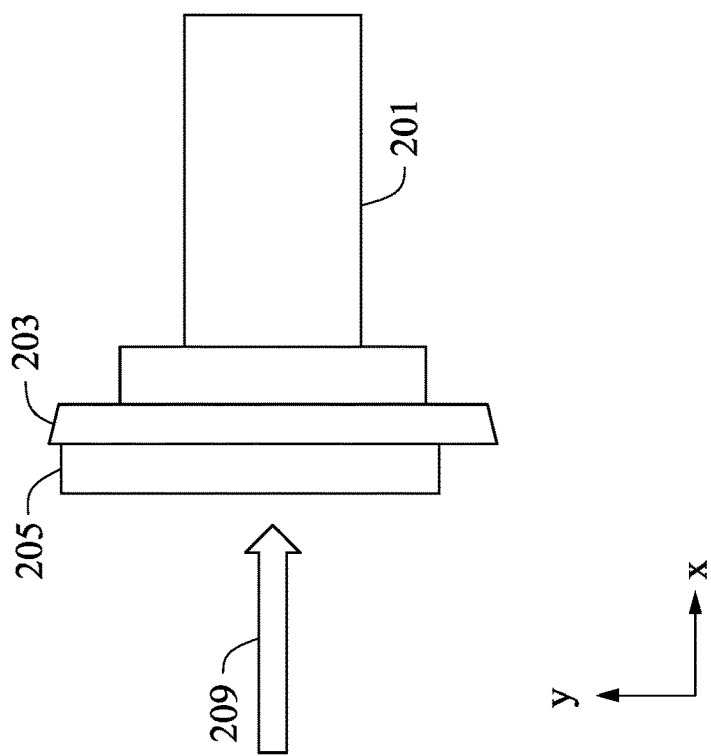

In FIGS. 10A and 10B, the wafer stage 201 rotates the wafer holder 203 and the wafer 205 around the central axis 202 of the wafer stage and an ion exposure process is performed on the wafer 205. The wafer stage 201 may rotate the wafer holder 203 and the wafer 205 such that major surfaces of the wafer holder 203 and the wafer 205 are perpendicular to or at a tilt angle to a major axis of an ion beam 209 to which the wafer 205 will be exposed. After the wafer 205 is tilted to an appropriate angle, the wafer stage 201 moves the wafer 205 in the x-direction and the z-direction, such that the ion beam 209 exposes the entire surface of the wafer 205. The ion exposure process may be any suitable process, such as an ion etching process, an ion implantation process, or the like. The ion beam 209 may be generated by an ion beam generator, which may include any number of an ion source, a mass analysis magnet, an aperture, a linear accelerator, a scanning unit, a converging unit, a final energy magnet, an end station, and/or a controller.

Because the position of the wafer 205 on the wafer holder 203 is corrected for any x-direction, y-direction, and rotational misalignments before exposing the wafer 205 to the ion beam 209, the entire major surface of the wafer 205 may be evenly exposed to the ion beam 209 for a desired exposure duration. This reduces within-wafer uniformity issues, reduces wafer-to-wafer process variations, reduces device defects caused by varied ion exposures, and improves device performance.

Figure 11:
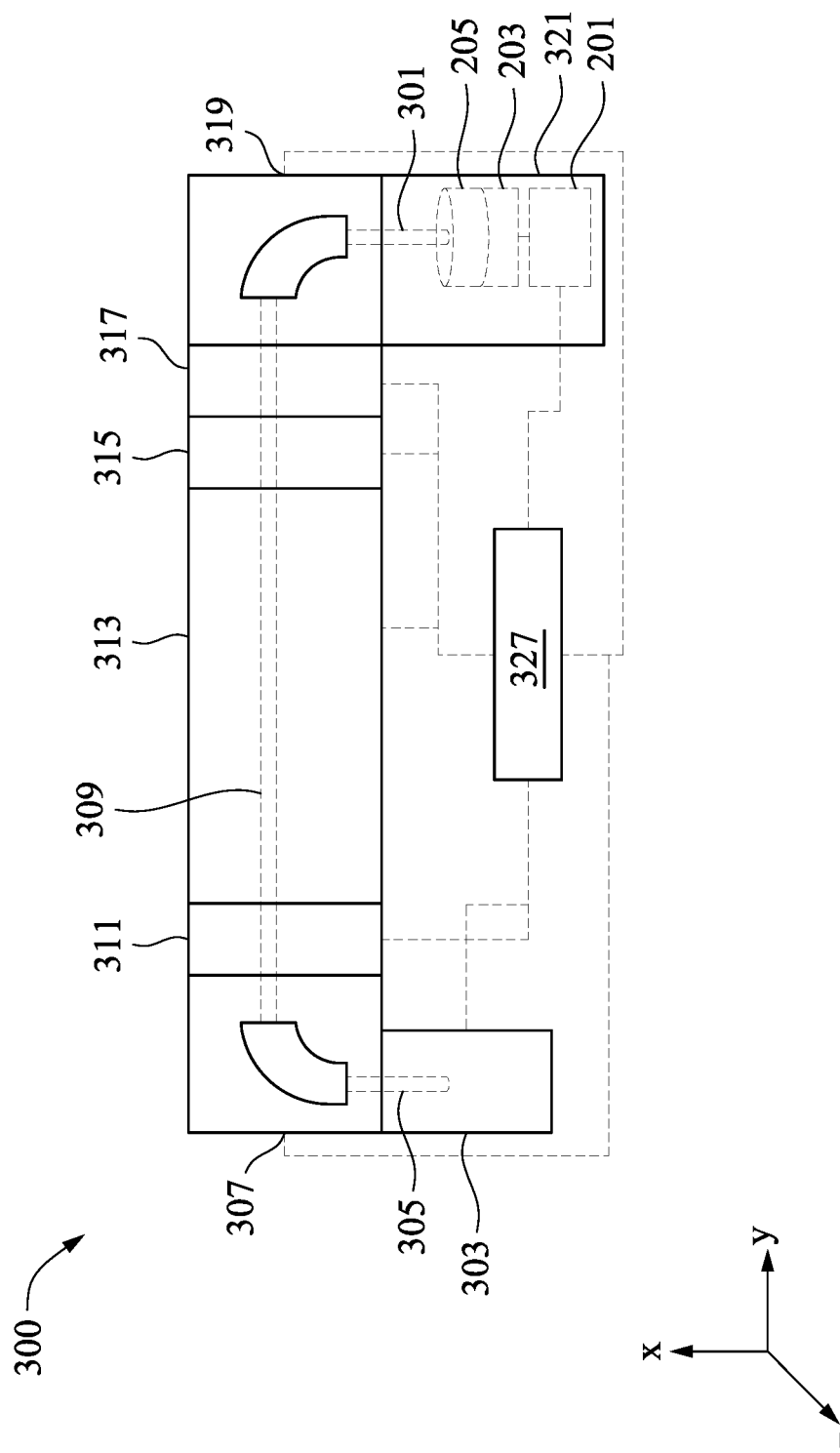
FIG. 11 is a plan view of an ion implanter, which may be used to perform the method, in accordance with some embodiments.

FIG. 11 illustrates an ion implanter 300, which may be used to expose the wafer 205 to an ion beam 301 for the ion exposure process (e.g., an ion implantation, an ion etching, or the like), in accordance with some embodiments. The ion implanter 300 may be used to direct the ion beam 301 at the wafer 205 in order to perform the ion exposure process 113 of the method 100. As illustrated in FIG. 11, the ion implanter 300 may include an ion source 303, a mass analysis magnet 307, an aperture 311, a linear accelerator 313, a scanning unit 315, a converging unit 317, a final energy magnet 319, an end station 321, a wafer stage 201 (including a wafer holder 203), and a controller 327 to control the operation of the ion implanter 300. Each of these pieces will be discussed in the following paragraphs.

The ion source 303 may include a variety of components which are used to generate an initial ion beam 305. For example, the ion source 303 may include ion separation devices, ion acceleration devices, multiples or combinations thereof, or the like. In some embodiments, the ion source 303 may be an arc discharge ion source. The ion source 303 may generate the initial ion beam 305 from various atoms or molecules, which may include boron (B), aluminum (Al), gallium (Ga), indium (In), carbon (C), silicon (Si), germanium (Ge), nitrogen ($N_2$), phosphorous (P), arsenic (As), antimony (Sb), oxygen ($O_2$), fluorine ($F_2$), helium (He), argon (Ar), carbon monoxide (CO), carbon dioxide ($CO_2$), boron mono-fluoride (BF), boron di-fluoride ($BF_2$), boron tri-fluoride ($BF_3$), silicon mono-fluoride (SiF), silicon di-fluoride ($SiF_2$), silicon tri-fluoride ($SiF_3$), silicon tetrafluoride ($SiF_4$), phosphorous dimer ($P_2$), silane ($SiH_4$), methane ($CH_4$), combinations thereof, or the like. However, other atoms or molecules may be used as the ion source 303 in some embodiments.

The ion source 303 may produce ions having a broad range of charge-to-mass ratios with only a certain narrower range of charge-to-mass ratios being suitable for the ion exposure process. As such, the initial ion beam 305 may be directed towards the mass analysis magnet 307. The mass analysis magnet 307 electromagnetically separates those ions having desired charge-to-mass ratios for the ion exposure process from those ions having undesired charge-to-mass ratios. Once a coherent ion beam 309 of ions having suitable charge-to-mass ratios is obtained, the coherent ion beam 309 may be sent to the aperture 311.

After the coherent ion beam 309 is obtained by the mass analysis magnet 307, the coherent ion beam 309 passes through the aperture 311 in order to further enhance and control the divergence of the coherent ion beam 309. In some embodiments, the aperture 311 is an aperture with an adjustable width that can adjust the magnitude of the coherent ion beam 309. For example, the aperture 311 may include adjustable and movable plates such that a spacing between the plates can be adjusted, thereby allowing for an adjustment of the beam current magnitude. Once the coherent ion beam 309 passes through the aperture 311, the coherent ion beam 309 may be sent to the linear accelerator 313.

The linear accelerator 313 may be used to impart additional energy to the coherent ion beam 309 as it passes through the linear accelerator 313. The linear accelerator 313 imparts this additional energy using a series of electrodes (not separately illustrated) that generate an electromagnetic field. When the coherent ion beam 309 passes through the electromagnetic field, the electromagnetic field works to accelerate the coherent ion beam 309. The linear accelerator 313 may include multiple electromagnetic fields and may vary the electromagnetic fields periodically with time or may adjust the phase of the electromagnetic fields to accommodate ions with different atomic numbers as well as ions having different initial speeds.

Once accelerated, the coherent ion beam 309 is directed towards the scanning unit 315. The scanning unit 315 may be used to scan the coherent ion beam 309 across the surface of the wafer 205. The scanning unit 315 may include at least a pair of horizontal electrodes and a pair of vertical electrodes for controlling horizontal scanning and vertical scanning of the coherent ion beam 309, respectively. In some embodiments, the scanning unit 315 may function to scan the coherent ion beam 309 to cover the entire wafer width of the wafer 205. As discussed above, the wafer stage 201 may be used to move the wafer 205 with respect to the ion beam 301 in order to expose the surface of the wafer 205 to the ion beam 301. As such, the scanning unit 315 may be omitted in some embodiments, or may be provided in addition to the wafer stage 201.

After the coherent ion beam 309 is passed through the scanning unit 315, the coherent ion beam 309 is passed through the converging unit 317. The converging unit 317 may be utilized to modify the convergence and divergence of the coherent ion beam 309, which may arrive from the linear accelerator 313 to the scanning unit 315 as a substantially parallel beam. In some embodiments, the converging unit 317 includes one or more (such as three) multipole lenses. The multipole lenses may include a uniformity multipole lens, a collimator multipole lens, combinations thereof, or the like. However, any suitable number and type of lenses may be utilized.

After the coherent ion beam 309 is passed through the converging unit 317, the coherent ion beam 309 is passed through the final energy magnet 319. The final energy magnet 319 may be used to remove ions and/or neutral particles that have been generated with undesired charge-to-mass ratios during the previous process of the ion implanter 300. The final energy magnet 319 may be similar to the mass analysis magnet 307 and may electromagnetically separate ions having desired charge-to-mass ratios for the ion exposure process from those ions having undesired charge-to-mass ratios.

After the coherent ion beam 309 is passed through the final energy magnet 319, the ion beam 301 is delivered to the end station 321. The end station 321 may house the wafer stage 201, which handles the wafer 205 which will be implanted with ions from the ion beam 301. The wafer stage 201 is utilized to move the wafer 205 relative to the ion beam 301 so as to expose the entire surface of the wafer 205 to the ion beam 301. As discussed above, the wafer stage 201 may include one or more driving units (not separately illustrated), which may be used to control the position of the wafer 205 relative to the ion beam 301.

In some embodiments, the ion beam 301 may be delivered to the end station 321 as a spot beam, which has a circular cross-section. In some embodiments, the ion beam 301 may be delivered to the end station 321 as a ribbon beam, which has a rectangular cross-section. The wafer stage 201 and the scanning unit 315 may be used in conjunction to scan the ion beam 301 across the surface of the wafer 205 such that a uniform ion distribution is achieved across the surface of the wafer 205. As discussed previously, the position of the wafer 205 on the wafer holder 203 of the wafer stage may be corrected prior to performing the ion exposure process, which further helps to ensure that a uniform ion distribution is achieved across the surface of the wafer 205. This reduces device defects, reduces device yield loss, and improves device performance.

The controller 327 is used to control the operating parameters of the ion implanter 300 during operation. The controller 327 may be implemented in either hardware or software, and the parameters may be hardcoded or fed into the controller 327 through an input port. The controller 327 may be used to store and control parameters associated with the operation of the ion implanter 300, such as the desired ion beam current, the current to the accelerator electrodes, and the like. Additionally, the controller 327 may also be used to control the wafer stage 201 and, more specifically, the driving units of the wafer stage 201, which, in turn, control the position, direction of movement, tilt angle, and the like of the wafer 205 with respect to the ion beam 301.

Embodiments may achieve advantages. For example, including the x-direction light emitter/detector pair, the y-direction light emitter/detector pair, the rotational camera 221, and/or the rotational light emitter/detector pair in the ion exposure apparatus allows for the method 100 to be performed and for misalignments between the wafer 205 and the wafer holder 203 to be corrected before performing an ion exposure process on the wafer 205. This improves the uniformity of the ion exposure process across the surface of the wafer 205, reduces wafer-to-wafer process variations, reduces device defects, and improves device performance.

In accordance with an embodiment, a semiconductor alignment apparatus includes a wafer stage; a wafer holder over the wafer stage; a first position detector configured to detect an alignment of a wafer over the wafer holder in a first direction; a second position detector configured to detect an alignment of the wafer over the wafer holder in a second direction; and a rotational detector configured to detect a rotational alignment of the wafer over the wafer holder. In an embodiment, the first direction is perpendicular to the second direction. In an embodiment, the first position detector includes a first light emitter and a first light detector, and the second position detector includes a second light emitter and a second light detector. In an embodiment, the rotational detector includes a camera. In an embodiment, the semiconductor alignment apparatus further includes an ion beam generator configured to generate an ion beam, a major axis of the first light emitter and a major axis of the second light emitter being in a plane parallel to a major axis of the ion beam. In an embodiment, the rotational detector includes a third light emitter and a third light detector. In an embodiment, a major axis of the third light emitter extends through the plane parallel to the major axis of the ion beam at an angle oblique to the plane parallel to the major axis of the ion beam.

In accordance with another embodiment, a method includes loading a wafer on a wafer holder; performing a first scan to determine a first misalignment of the wafer with respect to the wafer holder in a first direction; performing a second scan to determine a second misalignment of the wafer with respect to the wafer holder in a second direction; and shifting a position of the wafer holder in at least one of the first direction or the second direction to correct for the first misalignment and the second misalignment. In an embodiment, the method further includes tilting the wafer holder; and exposing the wafer to an ion beam. In an embodiment, performing the first scan includes moving the wafer holder in the first direction and using a first laser emitter/detector pair to detect a first side surface of the wafer, and performing the second scan includes moving the wafer holder in the second direction and using a second laser emitter/detector pair to detect a second side surface of the wafer. In an embodiment, the method further includes performing a rotational scan to determine a rotational misalignment of the wafer with respect to the wafer holder; and rotating the wafer holder to correct for the rotational misalignment. In an embodiment, performing the rotational scan includes capturing an image of the wafer with a camera and performing analysis on the image captured by the camera to determine the rotational misalignment of the wafer with respect to the wafer holder. In an embodiment, the wafer includes a notch in a side surface thereof, and performing the rotational scan includes rotating the wafer holder and using a laser emitter/detector pair to detect the notch. In an embodiment, the wafer includes a notch in a side surface thereof, performing the rotational scan includes rotating the wafer holder and using a laser emitter/detector pair to detect the notch, and performing the rotational scan further includes capturing an image of the wafer with a camera and performing analysis on the image captured by the camera.

In accordance with yet another embodiment, a method includes loading a wafer on a wafer holder; performing a rotational scan to determine a rotational misalignment of the wafer with respect to the wafer holder; rotating the wafer holder to correct for the rotational misalignment; tilting the wafer holder; and exposing the wafer to an ion beam. In an embodiment, the ion beam is generated by an ion beam generator, and a major surface of the wafer is parallel to a major axis of the ion beam generator while performing the rotational scan and rotating the wafer holder. In an embodiment, performing the rotational scan includes capturing an image of the wafer with a camera and performing analysis on the image captured by the camera to determine the rotational misalignment of the wafer with respect to the wafer holder. In an embodiment, the wafer includes a notch in a side surface thereof, and performing the rotational scan includes rotating the wafer holder and using a laser emitter/detector pair to detect the notch. In an embodiment, the method further includes performing a first scan to determine a first misalignment of the wafer with respect to the wafer holder in a first direction; performing a second scan to determine a second misalignment of the wafer with respect to the wafer holder in a second direction; and shifting a position of the wafer holder in at least one of the first direction or the second direction to correct for the first misalignment and the second misalignment. In an embodiment, the first scan is performed using a first light emitter/light detector pair, and the second scan is performed using a second light emitter/light detector pair.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor alignment apparatus comprising:
a wafer stage;
a wafer holder over the wafer stage;
a first position detector configured to detect an alignment of a wafer over the wafer holder in a first direction, wherein the first position detector comprises a first light emitter and a first light detector;
a second position detector configured to detect an alignment of the wafer over the wafer holder in a second direction;
a rotational detector configured to detect a rotational alignment of the wafer over the wafer holder; and
an ion beam generator configured to generate an ion beam, wherein a major axis of the first light emitter is in a plane parallel to a major axis of the ion beam.

2. The semiconductor alignment apparatus of claim 1, wherein the first direction is perpendicular to the second direction.

3. The semiconductor alignment apparatus of claim 1, wherein the second position detector comprises a second light emitter and a second light detector.

4. The semiconductor alignment apparatus of claim 1, wherein the rotational detector comprises a camera.

5. The semiconductor alignment apparatus of claim 1, wherein a major axis of the second light emitter is in the plane parallel to the major axis of the ion beam.

6. The semiconductor alignment apparatus of claim 5, wherein the rotational detector comprises a third light emitter and a third light detector.

7. The semiconductor alignment apparatus of claim 6, wherein a major axis of the third light emitter extends through the plane parallel to the major axis of the ion beam at an angle oblique to the plane parallel to the major axis of the ion beam.

8. A method comprising:
loading a wafer on a wafer holder;
performing a first scan to determine a first misalignment of the wafer with respect to the wafer holder in a first direction, wherein performing the first scan comprises moving the wafer holder in the first direction and using a first light emitter/detector pair to detect a first side surface of the wafer;
performing a second scan to determine a second misalignment of the wafer with respect to the wafer holder in a second direction;
shifting a position of the wafer holder in at least one of the first direction or the second direction to correct for the first misalignment and the second misalignment; and
exposing the wafer to an ion beam, wherein a major axis of the first light emitter/detector pair is in a plane parallel to a major axis of the ion beam.

9. The method of claim 8, further comprising:
tilting the wafer holder prior to exposing the wafer to the ion beam.

10. The method of claim 8, wherein performing the second scan comprises moving the wafer holder in the second direction and using a second light emitter/detector pair to detect a second side surface of the wafer.

11. The method of claim 8, further comprising:
performing a rotational scan to determine a rotational misalignment of the wafer with respect to the wafer holder; and
rotating the wafer holder to correct for the rotational misalignment.

12. The method of claim 11, wherein performing the rotational scan comprises capturing an image of the wafer with a camera and performing analysis on the image captured by the camera to determine the rotational misalignment of the wafer with respect to the wafer holder.

13. The method of claim 11, wherein the wafer comprises a notch in a side surface thereof, and wherein performing the rotational scan comprises rotating the wafer holder and using a light emitter/detector pair to detect the notch.

14. The method of claim 11, wherein the wafer comprises a notch in a side surface thereof, wherein performing the rotational scan comprises rotating the wafer holder and using a light emitter/detector pair to detect the notch, and wherein performing the rotational scan further comprises capturing an image of the wafer with a camera and performing analysis on the image captured by the camera.

15. A method comprising:
loading a wafer on a wafer holder;
performing a first scan to determine a first misalignment of the wafer with respect to the wafer holder in a first direction;
performing a second scan to determine a second misalignment of the wafer with respect to the wafer holder in a second direction;
shifting a position of the wafer holder in at least one of the first direction or the second direction to correct for the first misalignment and the second misalignment;
after shifting the position of the wafer holder in the at least one of the first direction or the second direction to correct for the first misalignment and the second misalignment, performing a rotational scan to determine a rotational misalignment of the wafer with respect to the wafer holder;
rotating the wafer holder to correct for the rotational misalignment;
tilting the wafer holder; and
exposing the wafer to an ion beam.

16. The method of claim 15, wherein the ion beam is generated by an ion beam generator, and wherein a major surface of the wafer is parallel to a major axis of the ion beam generator while performing the rotational scan and rotating the wafer holder.

17. The method of claim 15, wherein performing the rotational scan comprises capturing an image of the wafer with a camera and performing analysis on the image captured by the camera to determine the rotational misalignment of the wafer with respect to the wafer holder.

18. The method of claim 15, wherein the wafer comprises a notch in a side surface thereof, and wherein performing the rotational scan comprises rotating the wafer holder and using a light emitter/detector pair to detect the notch.

19. The method of claim 15, wherein the first scan is performed using a first light emitter/light detector pair, and wherein the second scan is performed using a second light emitter/light detector pair.

20. The method of claim 19, wherein a major axis of the first light emitter/light detector pair is in a plane parallel to a major axis of the ion beam, and wherein a major axis of the second light emitter/light detector pair is in the plane parallel to the major axis of the ion beam.

* * * * *